US008500907B2

(12) United States Patent
Bohnheio et al.

(10) Patent No.: US 8,500,907 B2
(45) **Date of Patent: *Aug. 6, 2013**

(54) MASKING SYSTEM FOR THE MASKING OF A CYLINDER BORE

(75) Inventors: Christian Bohnheio, Haegglingen (CH); Gerard Barbezat, Winterthur (CH)

(73) Assignee: Sulzer Metco AG, Wohlen (CH)

( * ) Notice: Subject to any disclaimer, the term of this patent is extended or adjusted under 35 U.S.C. 154(b) by 1089 days.

This patent is subject to a terminal disclaimer.

(21) Appl. No.: 11/827,478

(22) Filed: Jul. 11, 2007

(65) Prior Publication Data

US 2008/0176000 A1 Jul. 24, 2008

(30) Foreign Application Priority Data

Jul. 24, 2006 (EP) .................................... 06117756

(51) Int. Cl.

| | |
|---|---|
| ***C23C 16/50*** | (2006.01) |
| ***C23C 16/00*** | (2006.01) |
| ***C23F 1/00*** | (2006.01) |
| ***H01L 21/306*** | (2006.01) |

(52) U.S. Cl.
USPC ........ 118/720; 118/504; 118/721; 156/345.1; 156/345.11; 156/345.19; 156/345.3

(58) Field of Classification Search
USPC ......... 118/720, 721, 504; 156/345.1, 345.11, 156/345.19, 345.3; 216/41–51
See application file for complete search history.

(56) References Cited

U.S. PATENT DOCUMENTS

| | | | | |
|---|---|---|---|---|
| 5,573,814 | A | 11/1996 | Donovan | |
| 6,572,704 | B2 * | 6/2003 | Keller | 118/504 |
| 7,874,262 | B2 * | 1/2011 | Bohnheio et al. | 118/504 |
| 2001/0029886 | A1 | 10/2001 | Keller | |
| 2002/0098280 | A1 * | 7/2002 | Otsuka | 427/129 |
| 2006/0172066 | A1 * | 8/2006 | Takahashi et al. | 427/236 |

FOREIGN PATENT DOCUMENTS

| | | | |
|---|---|---|---|
| EP | 1077090 | A2 | 2/2001 |
| EP | 1136583 | A1 | 9/2001 |
| EP | 1685910 | A1 | 8/2006 |

* cited by examiner

*Primary Examiner* — Maureen Gramaglia
*Assistant Examiner* — Tiffany Nuckols
(74) *Attorney, Agent, or Firm* — Kilpatrick Townsend & Stockton LLP

(57) ABSTRACT

The invention relates to a masking system for masking a cylinder bore (2) of a combustion engine (3) during a thermal coating procedure including a masking body (4) which can be placed during the thermal coating of a first cylinder (5) of the combustion engine (3) in the cylinder bore (2) of a second cylinder (7) to cover a cylinder wall (6) of the second cylinder (7). In this arrangement the masking body (4) is designed in such a way that a flow gap (10) of predeterminable breadth can be set between the masking body (4) and the cylinder wall (6) of the second cylinder (7) for the production of a flow (8) of a fluid (9).

19 Claims, 2 Drawing Sheets

MASKING SYSTEM FOR THE MASKING OF A CYLINDER BORE

CROSS REFERENCE TO RELATED APPLICATIONS

This application claims the priority of European Patent Application No. 06117756.4, dated Jul. 24, 2006, the disclosure of which is incorporated herein by reference.

BACKGROUND OF THE INVENTION

The invention relates to a masking system for the masking of a cylinder bore of a combustion engine during a thermal coating procedure, and also to the use of such a masking system.

The thermal coating of cylinder running surfaces of combustion engines by means of different thermal spraying methods belongs nowadays to the state of the art and is used widely in engines for motor vehicles of all kinds, as well as in other applications. In this connection, the corresponding cylinder running surfaces are usually activated by different methods prior to the thermal coating, for example by other activating methods known per se. In this connection, substrates of lightweight metallic alloys based on Al or Mg are used most frequently.

A widely used type of engines are engines in a V-form, in other words engines which have two rows of cylinders extending parallel to one another, with the two longitudinal axes of two adjacent cylinder liners which each belong to one of the two cylinder rows being inclined relative to one another by a specific angle by which means the characteristic V-form of the engine block of a V-type engine results.

In such V-type engines the danger exists during thermal coating that during the coating of a cylinder wall of a cylinder bore of a first cylinder row vapors, for example metal vapors of the coating material, which are never to be avoided completely in thermal coating, are deposited on the cylinder wall of an adjacent cylinder of the second cylinder row. Through the deposition of the metal vapors on the relatively cold walls on the cylinder wall of the cylinder of the second cylinder row, this cylinder wall in the second cylinder row is contaminated by the metal vapors, which has among other things a negative effect on the adhesion of a coating which is to be likewise applied to this cylinder later. Moreover, contamination by unmelted particles and overspray is to be feared.

A further problem is the heating of the engine block by the thermal coating procedure. Since the difference in thermal expansion coefficient between the thermal spray layer and the substrate can be relatively high, a temperature of the substrate above 120° C., which basically means a kind of average temperature of the engine block, has a negative effect on the residual stress level of the layers, and above 150° there is even the danger that the component which is manufactured of a lightweight metal alloy, in other words the engine block, will suffer distortion of the material and thus will become unusable.

These problems become particularly clear if one considers the thermal expansion coefficients of typically used materials: Typical expansion coefficients of thermal spray layers made of iron-based alloys are for example approximately $11\times10^{-6}/°$ C., whereas typical thermal expansion coefficients of aluminum based substrates are approximately $23\times10^{-6}/°$ C. and in the case of magnesium based substrates can typically be approximately $27\times10^{-6}/°$ C. This means that typical thermal expansion coefficients of the substrates, in other words of the material from which the engine blocks are manufactured, are of a size of an order of magnitude more than twice that of the thermal expansion coefficients of the sprayed on thermal spray layers.

Various apparatuses are known in the prior art which attempt in particular to solve the problem of the contamination of cylinder running surfaces with the aforementioned metal vapors.

Thus apparatuses are known in which cylinder bores which are not coated are sealed with a kind of inflatable balloon which however can lead to heat accumulation and can further aggravate the above-mentioned problems with the thermal expansion coefficients. There are other systems in use in which covers for the protection of the not-to-be-coated cylinder bores are introduced through the crankcase. Ultimately the thermal problems are not completely solved here either and, something which is equally important, the use of all known systems can only be automated with difficulty or not at all, in particular in the case of V-type engines, so that the coating process is ultimately very expensive because a lot of manual work is necessary for the coating of a large number of engine blocks.

SUMMARY OF THE INVENTION

It is therefore an object of the present invention to make available an apparatus with which the problems known from the prior art, in particular the thermal problems and the problems with the contamination by metal vapors during thermal coating of cylinder bores of combustion engines, are avoided and wherein, at the same time, a high degree of automation can be achieved simply and economically.

The invention thus relates to a masking system for masking of a cylinder bore of a combustion engine during a thermal coating procedure, including a masking body, which can be placed during the thermal coating of a first cylinder of the combustion engine in the cylinder bore of a second cylinder to cover a cylinder wall of the second cylinder. In this arrangement the masking body is designed in such a way that a flow gap of predeterminable breadth can be set between the masking body and the cylinder wall of the second cylinder for the generation of a flow of a fluid.

It is important to the invention that the masking system in accordance with the invention includes a masking body which, on the one hand, essentially completely covers a not-to-be-coated cylinder wall of a cylinder bore during the coating of another cylinder wall and thus protects this from the direct application of metal vapors which originate from a coating beam, with which the other cylinder is being coated. In other words it prevents the not-to-be-coated cylinder wall from being directly or indirectly exposed to the coating beam.

On the other hand, the masking body is so designed that a flow gap remains free between the masking body and the currently not-to-be-coated cylinder wall, so that an air flow can be produced therein which, on the one hand, effects a cooling of the engine block in the covered cylinder bore and, on the other hand, prevents metal dusts, which are distributed in the interior of the metal block, from indirectly depositing on the currently not-to-be-coated cylinder wall.

If one considers a special embodiment of the invention, then, by way of example, during the coating, a closed tube is introduced at an oppositely disposed cylinder between the tube and the cylinder running surface with a controlled flow gap. A flow of air or other fluids is achieved by means of corresponding apertures and a commensurate extraction system which cools the cylinder running surface and simultaneously prevents the deposition of metal vapors on this cylinder running surface, since the flows or turbulences of the metal vapors can be effectively held back.

In the coating of V-type cylinder crankcases, all the cylinders in a given row are preferably coated simultaneously. The cylinder row lying opposite this is protected by a masking system in accordance with the invention in such a way that, for example, a plasma beam of a rotating plasma spraying apparatus, which is fed through the cylinder bore in the axial direction during coating, and which could be able to reach into the oppositely disposed bore at the bottom dead center position, does not reach the cylinder walls of the not-to-be-coated row of cylinders. This means that the feared "overspraying" does not result—in other words, the contamination of a not-to-be-sprayed cylinder wall through overspraying from a cylinder bore which is currently being coated. This prevents the delamination of layers as known from the prior art, which occur when a cylinder wall previously contaminated with metal vapors is later coated.

Moreover, as has already been mentioned, a heating of the cylinder block due to the heat transfer of melted powder to the substrate, which necessarily takes place during the coating procedure, is reduced considerably. Overheating has to be avoided, in particular in the case of thin-walled components, because this can lead to overheating of the cylinder block, which can also result in damaging layer delaminations. These damaging effects are also avoided by the use of a masking system in accordance with the invention because, through the regulation of the flow of the fluid through the flow gap of the masking system of the present invention, an intelligent temperature management can be guaranteed during the coating procedure.

In a special embodiment the masking body is a hollow masking body and/or a solid masking body, preferably a hollow masking cylinder and/or a solid masking cylinder.

In this connection the masking body is preferably designed in such a way that the flow gap has a width of 0.1 mm to 10 mm, preferably a width between 0.2 mm and 5 mm, especially a width between 0.4 mm and 3 mm. This guarantees at the same time that the flow gap is narrow enough that a direct contamination of the cylinder wall of the cylinder protected by the masking body can be prevented and at the same time a sufficiently strong flow can be maintained in the flow gap so that an adequate cooling can be achieved.

In a special embodiment a masking system in accordance with the invention includes at least two masking bodies, so that at least two cylinders, preferably two adjacent cylinders, can be masked simultaneously. In an embodiment which is particularly important for practical use, the masking system includes a predeterminable number of masking bodies and is designed in such a way that a complete row of cylinders of a V-type combustion engine can be masked simultaneously.

The masking body preferably includes a masking cover and the masking cover includes in particular a passage connectable to the flow gap, in particular an outlet passage and/or an inlet passage for conveying the fluid. In this connection the passage can have openings of which one or more can be provided in the masking cover, via which the fluid, for example air or a different gas, can be sucked away by means of a suction apparatus which can be provided at the crank housing, so that in this way the flow can be generated in the flow gap between the masking body and the cylinder wall.

It goes without saying that in another embodiment air or another gas can be introduced via the openings, of which a plurality can be provided in the masking cover and can be arranged for example in a circle near to an edge of the masking cover, into the flow gap under a predeterminable pressure or can be sucked away via the openings. The flow direction of the fluid is either directed into the crank housing or out of this, depending on whether the fluid is blown into the openings under pressure or is sucked out of them. The person averagely skilled in the art understands that, depending on the requirements, the shape of the openings can be different, for example circular openings, slit-shaped openings or openings of another suitable shape can be provided.

The fluid is preferably, though not necessarily, a gas or a gas mixture, especially air and/or nitrogen and/or a noble gas, in particular argon and/or helium.

As already mentioned, a suction means can be provided at the crank space of the engine housing to be coated, so that the flow of the fluid through the flow gap can be sucked away through the crank space of the combustion engine.

Alternatively, as likewise already explained for a special example, a feed means can be provided for feeding the fluid into the flow gap, so that the flow of the fluid through the flow gap can be produced at a predetermined feed pressure.

A flow speed of the fluid in the flow gap is preferably higher than 1 m/s, in particular higher than 10 m/s, and is especially between 1 m/s and 150 m/s, preferably between 10 m/s and 80 m/s. In this way, on the one hand, an adequate cooling of the engine block is achieved and, on the other hand, an adequately strong flow is produced in the flow gap on the one hand so that no metal vapor is able to precipitate on a not-to-be coated cylinder running surface, which is protected by a masking system in accordance with the invention.

In particular in order to advantageously automate the coating procedure of cylinder running surfaces of engine blocks for industrial mass production, a manipulator, in particular a programmed robot system, can be provided, so that the masking body can be placed in the cylinder bore automatically in accordance with a predetermined program starting scheme.

Furthermore, a supply unit for preparing the fluid can be provided, which is preferably controlled or regulated by program control so that, for example, the through flow amount and/or the pressure and/or the through flow speed of the fluid flow in the flow gap can be controlled and/or regulated and can, for example, be controlled and/or regulated in dependence on certain coating parameters, such as temperature, the nature of the coating apparatus used, the nature of the coating material and the nature of the coating method.

The invention further relates to the use of a masking system in accordance with the invention, such as is described in detail in the application, wherein the thermal coating procedure includes a plasma spraying method, preferably a plasma APS method, a flame spraying method, in particular a high speed flame spraying method, and/or another thermal spraying method, such as an arc wire spraying method for example.

In this connection a masking system in accordance with the invention is used in particular as protection against contamination of a cylinder bore and/or for cooling during the thermal coating procedure.

It is understood that the use in this connection can not only relate to the prevention of overspray on an already coated cylinder bore of a first cylinder, but also to the prevention of overspray of a still uncoated cylinder bore.

In the following the invention will be explained more closely with the help of the drawing.

DESCRIPTION OF THE PREFERRED EMBODIMENTS

Figure 1:
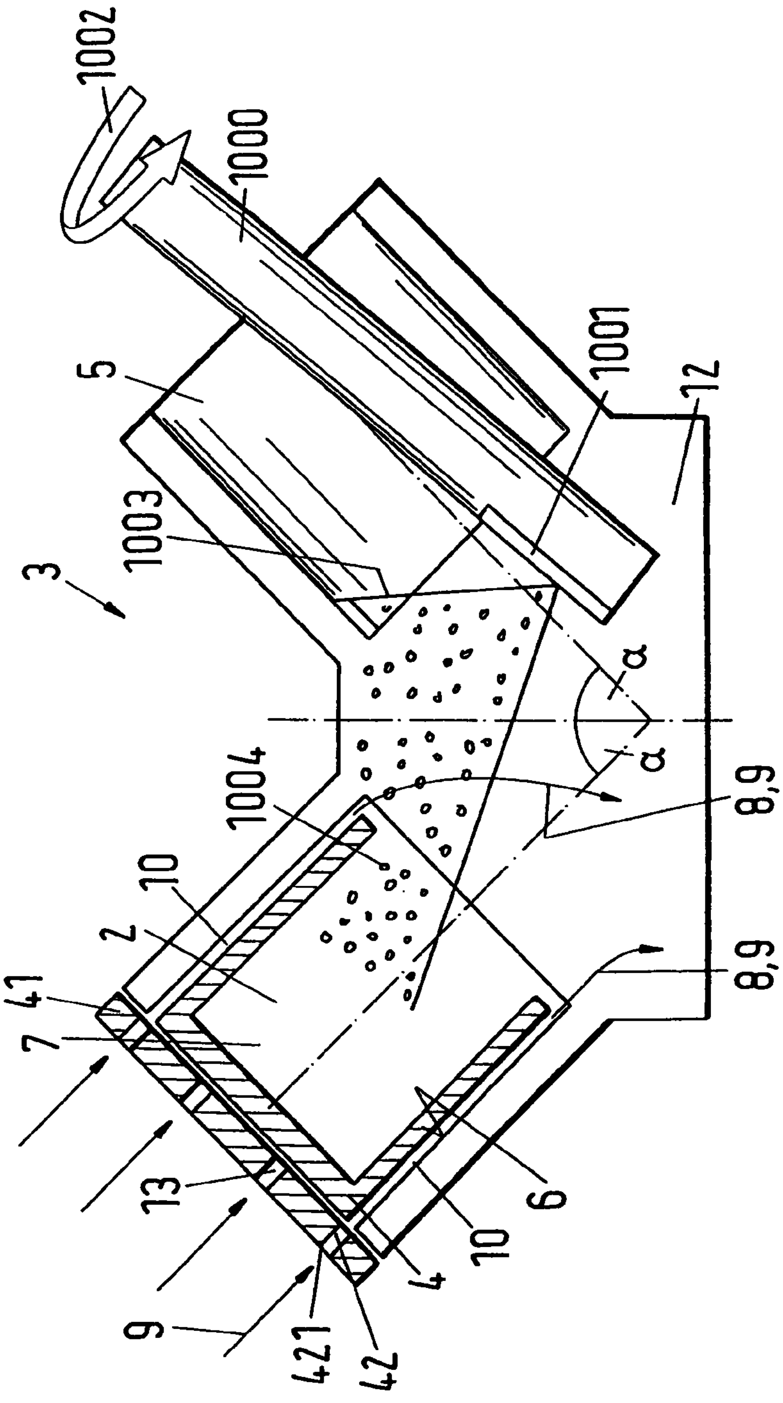
FIG. 1 is a schematic sectional view of a cylinder block of a V-type engine with a masking system in accordance with the invention.

FIG. 1 shows in an illustration in section a simple embodiment of a masking system in accordance with the invention during the coating of a cylinder bore of a V-type engine, with reference to which the method of functioning of a masking system in accordance with the invention, which is referred to in the whole of the following with the reference numeral 1, will be schematically explained.

A section through an engine block of a V-type engine is illustrated in FIG. 1, the two rows of cylinders of which are arranged parallel to one another in a method known per se at an angle of inclination α.

A first cylinder 5, the right cylinder in accordance with the illustration, is being coated with a rotating plasma spray gun 1000 known per se. The plasma spray gun rotates during the coating procedure in the cylinder 5 about a longitudinal axis, as indicated by the arrow 1002, and is fed while rotating in the axial direction through the cylinder bore during the coating procedure. At a lower end of the plasma spraying gun 1000 a plasma beam 1003 with a coating material 1004 emerges from a spray opening 1001 and the cylinder wall of the cylinder 5 is coated using said coating material 1004.

As FIG. 1 shows, the plasma spray gun 1000 is located exactly in the proximity of its lower reversal point; i.e. the plasma beam 1003 with coating material 1004 does not just strike the cylinder wall to be coated of the cylinder 5, but rather extends into the crank housing of the V-type engine and moreover right up to and into the not-to-be-coated second cylinder 7.

This means that, without the use of a masking system 1 in accordance with the invention, the cylinder wall 6 of the second cylinder 7 would be contaminated with coating material 1004 and furthermore heated excessively by the plasma beam 1003.

In order to prevent this a masking body 4 in accordance with the present invention is provided in the cylinder bore 2 of the second cylinder 7, which is designed as a hollow cylinder 4 in the present example of FIG. 1 and additionally includes a masking cover 41. The masking cover 41, which forms a cover on the second cylinder 7 or on the masking body 4, includes a passage 42 with openings 421 connected to the flow gap 10, which is formed between the masking cylinder 4 and the cylinder wall 6, the passage 42 being formed as an inlet passage 42 for conveying the fluid 9 into the flow gap 10.

The flow 8 of the fluid 9 in the flow gap 10 is produced in this arrangement by a suction means not explicitly illustrated in FIG. 1, which produces a predeterminable negative pressure in the crank housing in a manner known per se to the person averagely skilled in the art, so that air is sucked through the openings 421 in the masking cover 41, which then flows through the flow gap 10 connected to the opening 421, so that the cylinder 7 and thus the complete engine block of the combustion engine is cooled on the one hand and on the other hand a deposition of metal vapors on the cylinder wall 6 of the second cylinder 7 is prevented.

Figure 2:
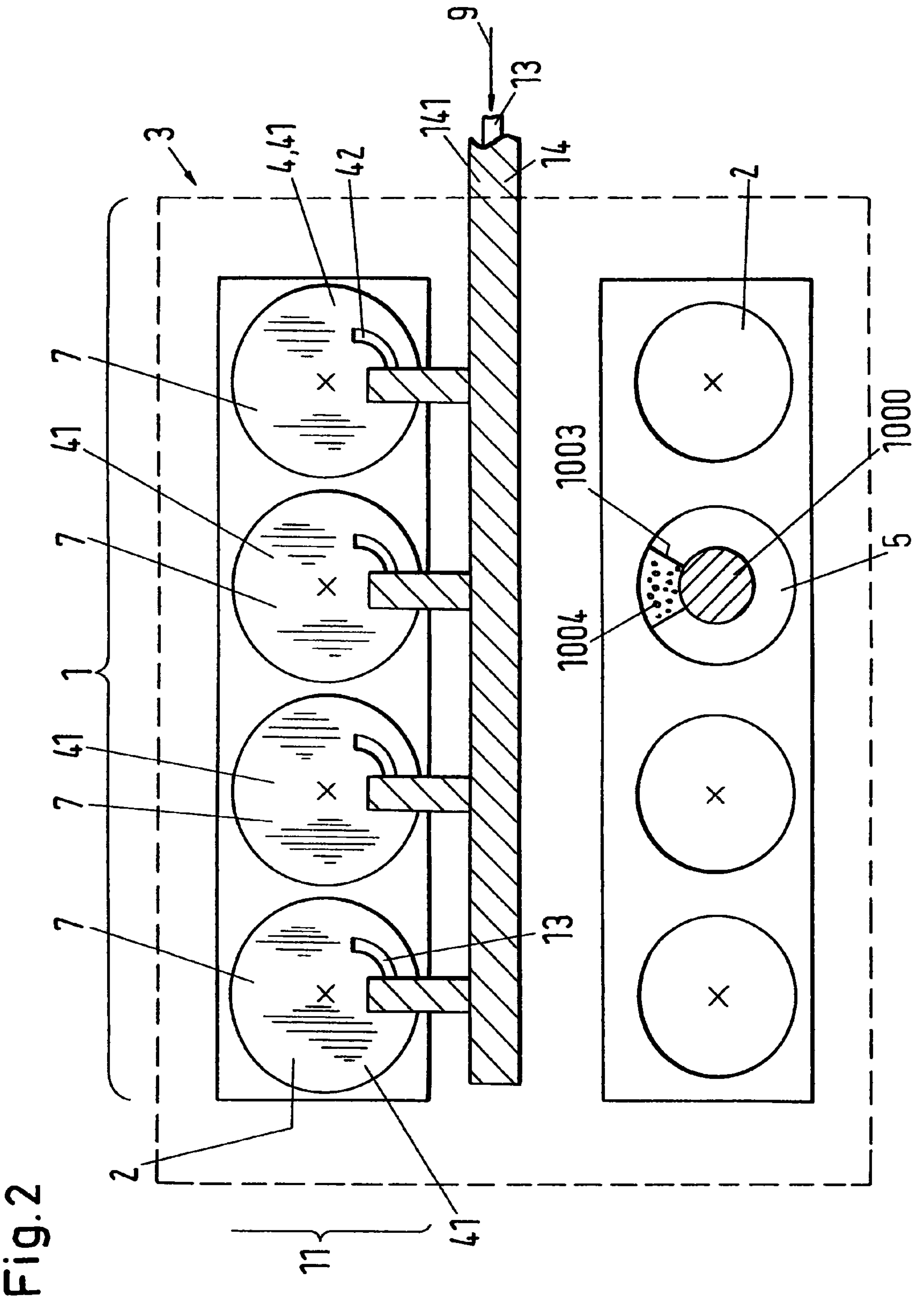
FIG. 2 is a schematic plan view of an eight-cylinder V-engine with a robot aided masking system.

An eight-cylinder V-type engine with a robot aided masking system is illustrated schematically in FIG. 2.

FIG. 2 shows an eight-cylinder V-type engine 3 with a lower row of cylinders according to the drawing, in which the cylinder 5 is coated by means of a plasma spray pistol 1000 by a plasma beam with coating material 1004.

The upper row of cylinders 11 according to the drawing of the combustion engine 3 is simultaneously completely masked by a masking system 1 in this connection and thus protected from the dangerous overspray from the coating beam 1003 with which precisely the cylinder 5 of the lower row is coated, and it is cooled by the fluid 9 at the same time.

The special embodiment of a masking system 1 of FIG. 2 in accordance with the invention which is particularly important for practical use includes four masking cylinders 4, each with a masking cover 41, the masking cylinder 4 being placed in the cylinder bores 2 of the second cylinder 7.

The four masking cylinders 4 are mounted on a support arm 141 of a robot system 14 via the four masking covers 41, so that by means of the robot system all second cylinder bores 7 can be masked or unmasked simultaneously, in that the drive not explicitly shown in FIG. 2 of the support arm 141 is moved in such a way that the masking cylinder can be lowered into the second cylinder 7 or extracted from it.

A feed means 13 is provided in or on the support arm 141 through which the fluid 9 can be conveyed to the flow gaps via the masking covers 41.

If, after coating of the lower row of cylinders according to the drawing, the upper row of cylinders is to be subsequently coated, all masking cylinders 4 can be extracted out of the upper row of cylinders at the same time by means of the robot system 14 and subsequently be placed in the lower row of cylinders for the protection of the cylinder walls. In this connection the engine block of the engine 3 can be arranged on a conveyor line for example, so that the cylinder bores of a plurality of engine blocks can be coated one after the other automatically. It is possible in this arrangement that the engine blocks are also additionally mounted on a manipulator or on a movable robot, so that, for example, the engine 3 can be pivoted, rotated or aligned in another suitable way for the placement of the masking system 1 in accordance with the invention.

The invention claimed is:

1. A masking system for masking a cylinder bore of a combustion engine during a thermal coating procedure, comprising:

a masking body which is configured to be placed during the thermal coating of a first cylinder of the combustion engine in the cylinder bore of a second cylinder, the second cylinder comprising a substantially cylindrical wall, the masking body being configured to mask a substantial portion of the second cylinder wall from the thermal coating, wherein the masking body is further configured to be placed within the cylinder bore such that a flow gap of substantially constant breadth is defined between the masking body and the cylinder wall of the second cylinder;

a masking cover comprising a passage directly connected to the flow gap for conveying a flow of a fluid along the gap; and a feed device configured to feed the fluid directly into the passage so that the flow of the fluid through the flow gap is produced at a specific, controlled feed pressure.

2. A masking system in accordance with claim 1, wherein the masking body is hollow.

3. A masking system in accordance with claim 1, wherein the flow gap has a width of 0.1 mm to 10 mm.

4. A masking system in accordance with claim 3, wherein the flow gap has a width between 0.2 mm and 5 mm.

5. A masking system in accordance with claim 4, wherein the flow gap has a width between 0.4 mm and 3 mm.

6. A masking system in accordance with claim 1, further comprising at least one additional masking body configured to be placed in the cylinder bore of a third cylinder such that the second and third cylinders are masked simultaneously.

7. A masking system in accordance with claim 6, wherein a total number of the masking bodies is the same as a number of cylinders in a complete row of cylinders of a V-type combustion engine, where the complete row of cylinders can be masked simultaneously.

8. A masking system in accordance with claim 1, wherein the fluid comprises a gas or a gas mixture.

9. A masking system in accordance with claim 8, wherein the gas or gas mixture comprises at least one member of the group consisting of air, nitrogen, argon and helium.

10. A masking system in accordance with claim 1, further comprising a suction device configured to suck the flow of the fluid away through the flow gap through a crank space of the combustion engine.

11. A masking system in accordance with claim 1, wherein the feed device is configured such that a flow speed of the fluid in the flow gap is higher than 1 m/s.

12. A masking system in accordance with claim 11, wherein the flow speed is between 1 m/s and 150 m/s.

13. A masking system in accordance with claim 12, wherein the flow speed is between 10 m/s and 80 m/s.

14. A masking system in accordance with claim 1, further comprising a programmed robot system configured and programmed to automatically place the masking body in the cylinder bore.

15. A masking system in accordance with claim 1, further comprising a supply unit for preparing the fluid.

16. A masking method for masking a cylinder bore of a combustion engine during a thermal coating procedure, comprising:

during the thermal coating of a first cylinder of the combustion engine, placing a masking body in the cylinder bore of a second cylinder, the second cylinder comprising a substantially cylindrical wall, the masking body being configured to mask a substantial portion of the second cylinder wall from the thermal coating, wherein placing the masking body comprises defining a flow gap of substantially constant breadth between the masking body and the cylinder wall of the second cylinder;

wherein a masking cover comprising a passage is directly connected to the flow gap for conveying a flow of a fluid along the gap;

the method further comprising feeding the fluid from a feed device directly into the passage to thereby produce the flow of the fluid through the flow gap at a specific, controlled feed pressure.

17. The method in accordance with claim 16, wherein the thermal coating procedure comprises a plasma spraying method, a flame spraying method, or another thermal spraying method.

18. The method in accordance with claim 16, further comprising using at least one of the masking body, the masking cover, and the feed device as protection against contamination of the cylinder bore or for cooling during the thermal coating procedure.

19. The method in accordance with claim 16, further comprising masking the cylinder bore of the first cylinder once the first cylinder has already been coated, for prevention of overspray.

* * * * *